United States Patent
LaClair et al.

(10) Patent No.: US 7,355,392 B2
(45) Date of Patent: Apr. 8, 2008

(54) PRINTED CIRCUIT CARD-BASED PROXIMITY SENSOR AND ASSOCIATED METHOD OF DETECTING A PROXIMITY OF AN OBJECT

(75) Inventors: Robert Downing LaClair, Richmond, VT (US); Lawrence Carl Maier, New Haven, VT (US); Anthony Dean Ringer, Vergennes, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 11/468,123

(22) Filed: Aug. 29, 2006

(65) Prior Publication Data

US 2006/0290347 A1 Dec. 28, 2006

Related U.S. Application Data

(62) Division of application No. 11/001,215, filed on Dec. 1, 2004.

(51) Int. Cl.
*G01R 33/12* (2006.01)
*G01B 7/14* (2006.01)

(52) U.S. Cl. .................. 324/207.26; 324/253; 336/234

(58) Field of Classification Search ........... 324/207.26, 324/253, 260; 29/592.1; 336/200, 210, 336/234, 83
See application file for complete search history.

(56) References Cited

U.S. PATENT DOCUMENTS

| | | | |
|---|---|---|---|
| 3,743,853 A | 7/1973 | Dittman et al. | |
| 4,122,708 A | 10/1978 | Maier | |
| 4,387,339 A | 6/1983 | Akerblom | |
| 4,587,486 A * | 5/1986 | Soyck | 324/236 |
| 4,950,986 A | 8/1990 | Guerrero | |
| 5,012,206 A | 4/1991 | Tigges | |
| 5,149,962 A | 9/1992 | Maurice | |
| 5,334,831 A | 8/1994 | Maurice | |
| 5,767,672 A | 6/1998 | Guichard et al. | |
| 5,936,403 A * | 8/1999 | Tamura | 324/260 |
| 6,270,686 B1 * | 8/2001 | Tamura | 216/22 |
| 6,424,145 B1 | 7/2002 | Woolsey et al. | |
| 6,949,925 B2 * | 9/2005 | Johnson et al. | 324/207.26 |
| 7,015,691 B2 | 3/2006 | Kang et al. | |

FOREIGN PATENT DOCUMENTS

| | | |
|---|---|---|
| EP | 0 232 243 A1 | 8/1987 |
| GB | 1128883 | 10/1968 |
| GB | 1224208 | 3/1971 |
| WO | WO 01/65695 A2 | 9/2001 |

OTHER PUBLICATIONS

Notice of Opposition to a European Patent, Patent No. 1264404, Appl. No. 01914594:5; Aug. 2003; available at <http://ofi.eopline.org/view/GetDossier> (visited Sep. 27, 2000).

* cited by examiner

*Primary Examiner*—Jay M Patidar
(74) *Attorney, Agent, or Firm*—Alston & Bird LLP

(57) ABSTRACT

A proximity sensor assembly includes a multilayer printed wiring board proximity sensor, the proximity sensor being operable as either a variable-reluctance sensor or an eddy current loss sensor. The proximity sensor includes a plurality of layers configured to form at least one wound coil disposed about at least a portion of a core. The coils are electrically driven to generate an alternating magnetic field such that the inductance of the coils changes when a permeable or conductive object is moved in relation to the magnetic field. The change in inductance is recognized and used to detect the proximity and presence of an object relative to the sensor.

19 Claims, 15 Drawing Sheets

PRINTED CIRCUIT CARD-BASED PROXIMITY SENSOR AND ASSOCIATED METHOD OF DETECTING A PROXIMITY OF AN OBJECT

CROSS-REFERENCE TO RELATED APPLICATIONS

This application is a divisional of U.S. application Ser. No. 11/001,215, filed Dec. 1, 2004, which is hereby incorporated herein in its entirety by reference.

FIELD OF THE INVENTION

The present invention generally relates to inductive proximity sensors and, more particularly, to variable reluctance-type inductive proximity sensors and methods of detecting a proximity of an object.

BACKGROUND OF THE INVENTION

Proximity sensors have many different applications in many different industries. In the aerospace industry, for example, proximity sensors can be used within an aircraft to detect the position of various movable components. For example, proximity sensors can be used to detect the position of aircraft landing gear, landing gear doors, spoilers, passenger doors, and/or cargo doors. In this regard, such proximity sensors can be used to indicate aircraft conditions such as weight-on-wheels, landing gear up/down, doors open/closed, and/or spoilers stowed/not stowed.

As will be appreciated, proximity sensors can be configured to detect the presence of an object in accordance with a number of different techniques including, for example, variable reluctance, eddy current loss, saturated core, and the Hall effect. Inductive proximity sensors typically include a core of a highly-permeable metal, where the core includes at least one, and more typically two, legs. Inductive coils are wound around one or more bobbins, which are placed over each leg of the core and bonded to the core, such as by means of an epoxy. While the shape of the core can vary, in one typical configuration, the core can comprise a C-shaped core. In such an instance, two coils are typically wound around bobbin(s), and placed over the legs of the core, in opposite directions (one wound clockwise and the other wound counter-clockwise) and electrically connected in series.

In accordance with a variable-reluctance proximity detection technique, an external AC current source drives the coils of the proximity sensor such that the proximity sensor generates an alternating magnetic field. Then, when a permeable and/or conductive object is brought or otherwise moved into the alternating magnetic field, the reluctance (i.e., air gap resistance) between the object and the proximity sensor changes, or more particularly, decreases. As the reluctance decreases, the inductance of the coils increases. This increase can then be measured to thereby detect the proximity of the object.

As indicated, the inductive coils of a proximity sensor are conventionally wound around bobbins, which are placed over and bonded to each leg of the core of the proximity sensor. In many conventional proximity sensors, these bonds can be undesirably weak, thereby increasing the likelihood of sensor failure, particularly under high-shock conditions. In addition, as bonding epoxies typically exhibit a high coefficient of thermal expansion, the bobbins and inductive coils wound around the bobbins, may move relative to the core during operation under higher-temperature conditions. Movement of the bobbin relative to the core may result in a change in the measured inductance of the sensor, which in various instances can exceed required sensor tolerances.

SUMMARY OF THE INVENTION

In light of the foregoing background, embodiments of the present invention provide an improved proximity sensor and method of detecting a proximity of an object, the proximity sensor being capable of operating as a variable-reluctance proximity sensor and/or an eddy current loss proximity sensor. Generally, like many conventional variable-reluctance and eddy current loss proximity sensors, the proximity sensor of embodiments of the present invention includes a core and a pair of wound coils disposed about legs of the core. In contrast to conventional variable-reluctance and eddy current loss proximity sensors, however, the proximity sensor of embodiments of the present invention is formed as a multilayered printed wiring board (PWB), otherwise known as a multilayered printed circuit board (PCB). In this regard, by forming the proximity sensor as a multilayered PWB, the proximity sensor need not include epoxy bonding of the constituent components of the sensor. Also, as a multilayerd PWB, the proximity sensor of embodiments of the present invention can be fabricated with greatly reduced cost, as compared to conventional proximity sensors. In addition, by forming the proximity sensor as a solid-state structure, the proximity sensor can operate with reduced, if not eliminated, movement of the coils with respect to the legs of the core. As such, the proximity sensor of embodiments of the present invention can operate with reduced failure under high-shock conditions, thereby increasing reliability of the sensor. Additionally, by reducing movement of the coils with respect to the core legs, the sensor of embodiments of the present invention can operate with increased accuracy over the duration of operation.

According to one aspect of the present invention, a proximity sensor assembly is provided, the proximity sensor assembly including a multilayer printed wiring board proximity sensor. The proximity sensor includes a plurality of layers configured to form at least one wound coil disposed about at least a portion of a core. The coils are capable of being electrically driven to generate an alternating magnetic field such that the inductance of the coils changes when a permeable object (particularly when operating as a variable-reluctance sensor) and/or a conductive object (particularly when operating as an eddy current loss sensor) is moved in relation to the magnetic field. Also, as the coils are electrically driven, a proximity of the object is capable of being detected based upon a change in the inductance of the coils.

In addition to the proximity sensor, the proximity sensor assembly can include a housing. The housing, in turn, includes a front surface and defines an interior chamber such that the proximity sensor is capable of being disposed within the interior chamber. In this regard, the proximity sensor is disposed within the interior chamber such that, when the coils are electrically driven, the sensor assembly is capable of generating a sensed area extending outward from the front surface of the housing within which the proximity of the permeable and/or conductive object is capable of being detected.

The layers of the multilayer printed wiring board can include at least one core layer, each core layer comprising a core pattern formed of a permeable material, the core patterns of the core layers comprising the core of the proximity sensor. In one advantageous embodiment, for example, the core pattern of each core layer can be formed of a lamination of the permeable material. In addition to the core layers, the layers can include a plurality of coil layers, each coil layer comprising at least one coil trace formed of a conducting material. In such instances, the core layers and the coil layers further include a plurality of through-conductors, such as plated through-holes. The coil traces can then be interconnected by the through-conductors to thereby form the wound coils. For example, the plurality of coil layers can include at least one pair of coil layers, the coil layers of each pair being disposed proximate opposite surfaces of the core layers. The coil traces of each pair can then be interconnected by the through-conductors to thereby form a layer of the wound coils. If so desired, a top coil layer can further include at least one pair of conductive pads, each conductive pad being electrically coupled to an end of the wound coils. The coils of the proximity sensor can then be electrically driven via the conductive pads.

The core pattern of each core layer can comprise a pair of legs. More particularly, for example, the core pattern of each core layer can include a base, the pair of legs and a pair of feet. The legs can extend in the same direction from opposite ends of the base, with the feet extending in opposite directions from respective legs. In such instances, the coil traces of the coil layers can then be interconnected by the through-conductors to thereby form a pair of wound coils, each wound coil being disposed about a leg of the core patterns of the core layers.

The proximity sensor assembly can further include a circuit coupled to the proximity sensor. In such instances, the circuit can be capable of detecting the proximity of the object based upon a change in the inductance of the coils. In further operation, the circuit can include an output terminal. Thus, the circuit can be capable of switchably producing an open condition or a closed condition at the output terminal based upon the proximity of the object. For example, when operating as a variable-reluctance sensor, the circuit can be capable of switchably producing an open condition when the inductance of the coils is below a threshold, and producing a closed condition when the inductance of the coils is at least as high as the threshold. Additionally or alternatively, when operating as an eddy current loss sensor, the circuit can be capable of switchably producing an open condition when the inductance of the coils is at least as high as a threshold, and producing an open condition when the inductance of the coils is below the threshold According to other aspects of the present invention, a proximity sensor, method of detecting a proximity of an object, and a method of fabricating a multilayer printed wiring board proximity sensor are provided. As indicated above and explained below, in contrast to conventional variable-reluctance and eddy current loss proximity sensors, the proximity sensor of embodiments of the present invention can be fabricated with greatly reduced cost, and can operate with reduced failure under high-shock conditions, thereby increasing reliability of the sensor. In addition, the sensor of embodiments of the present invention can operate with increased accuracy over the duration of operation. Therefore, the proximity sensor assembly, proximity sensor, method of detecting a proximity of an object, and method of fabricating a multilayer printed wiring board proximity sensor of the present invention solve the problems identified by prior techniques and provide additional advantages.

BRIEF DESCRIPTION OF THE DRAWINGS

Figure 1:
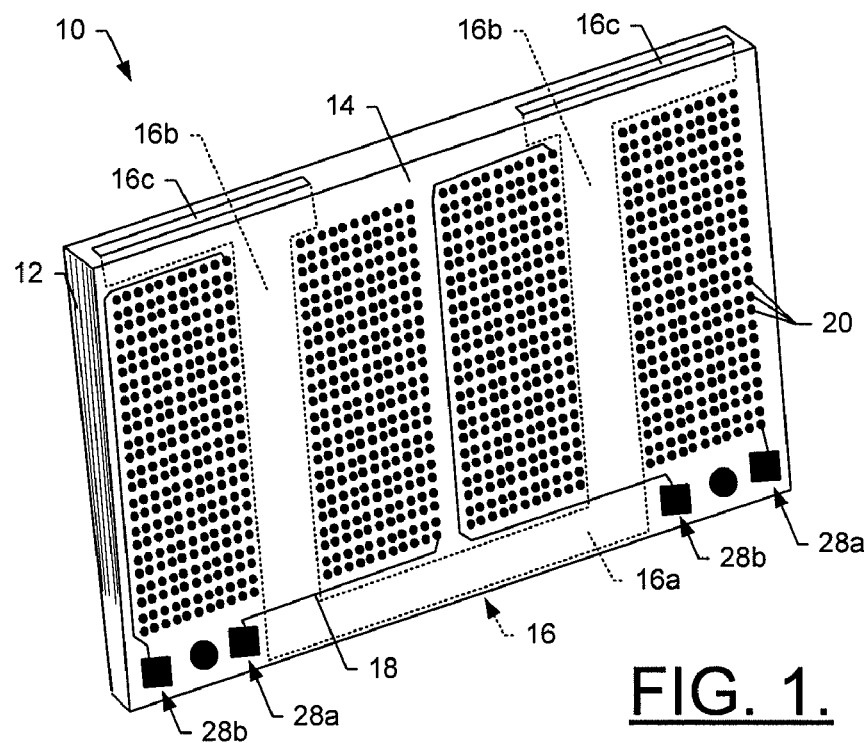
Figure 2:
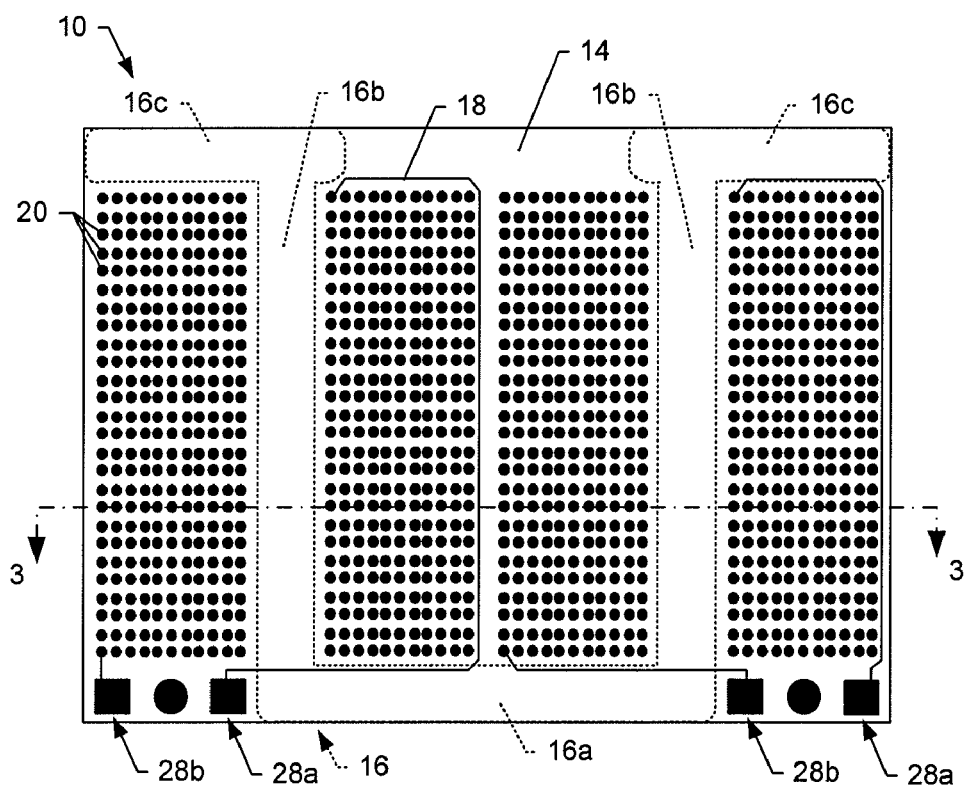
Figure 3:
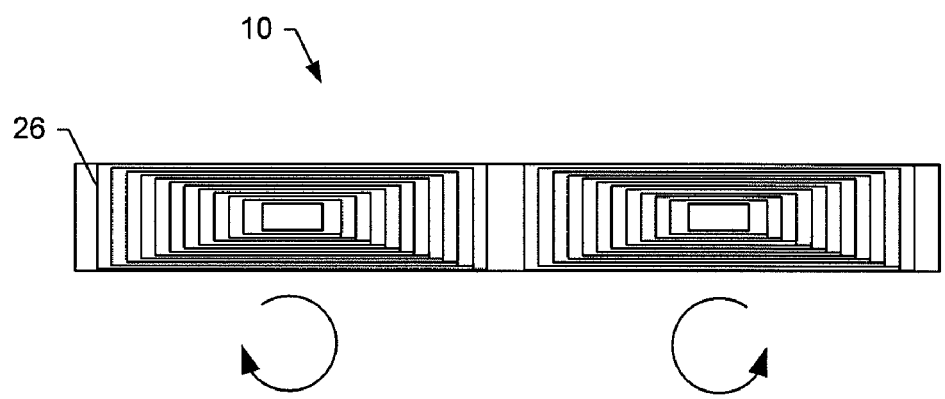
Figure 4:
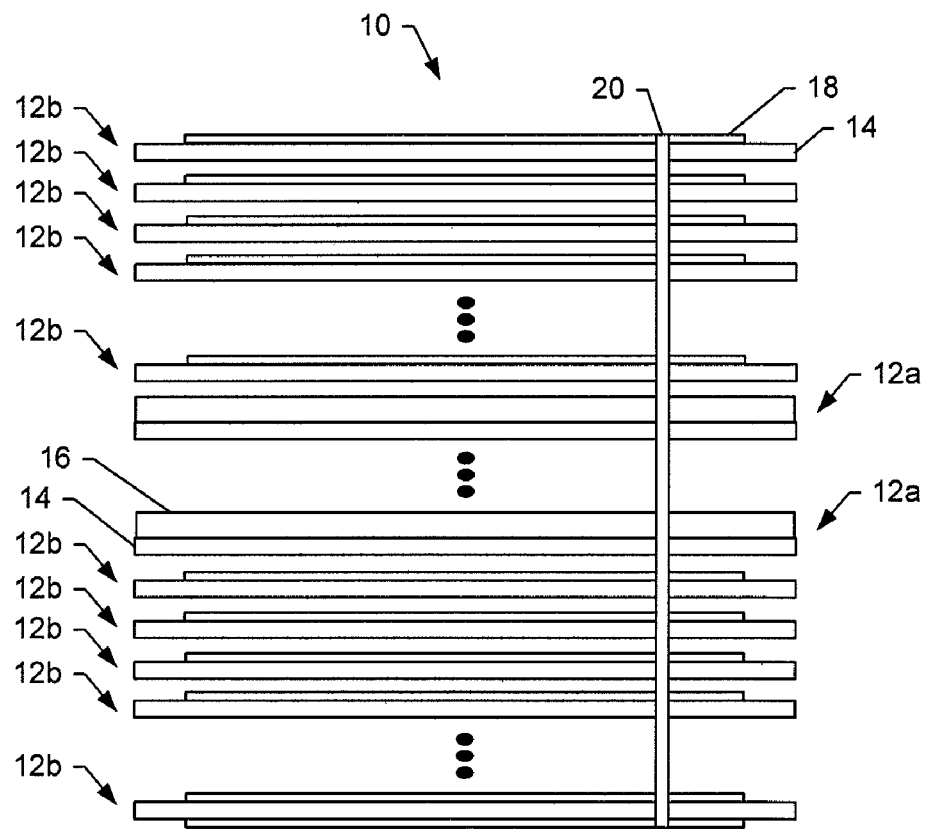
Figure 5:
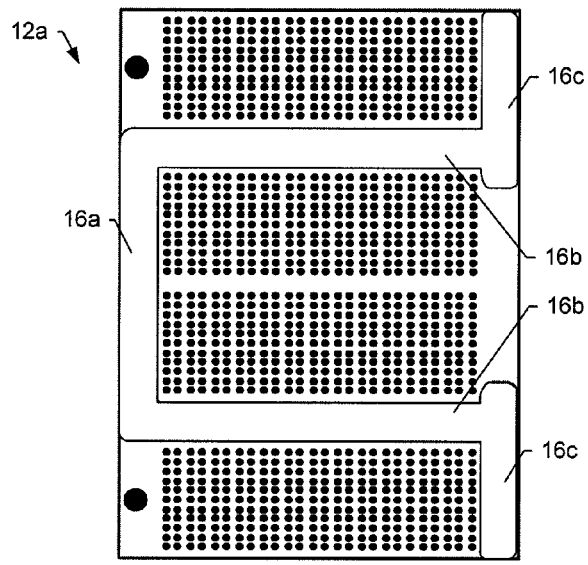
Figures 6A, 6B:
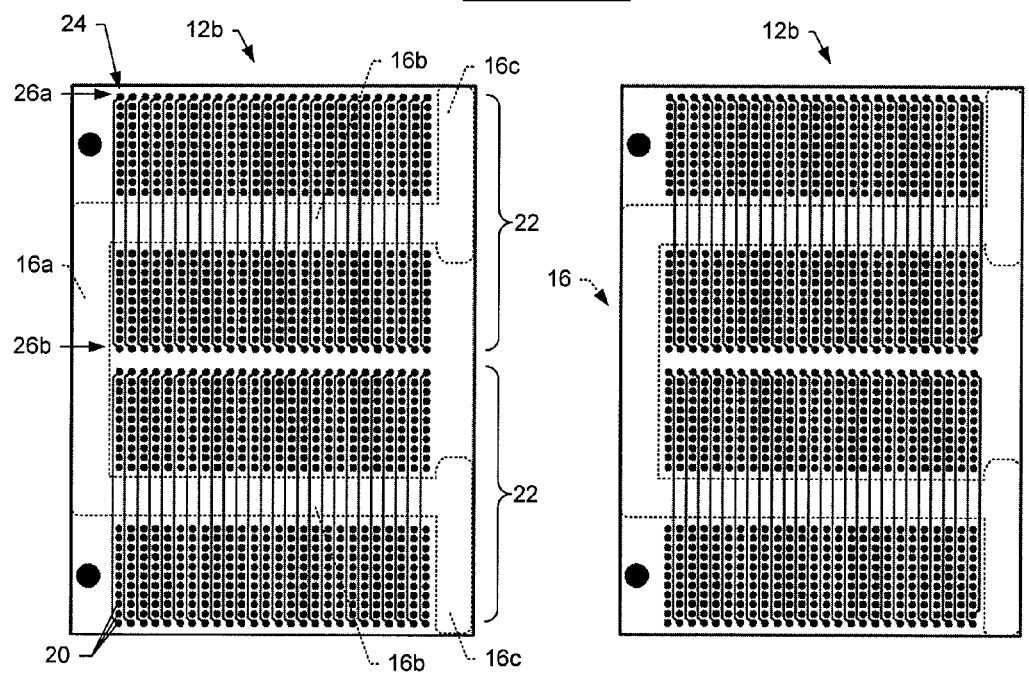
Figure 7:
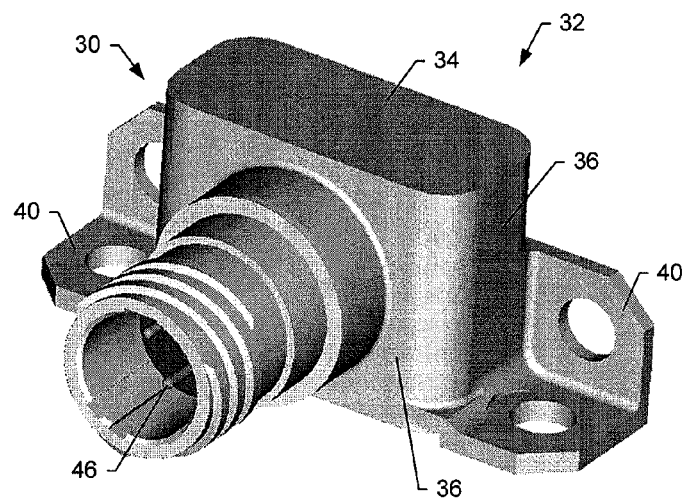
Figure 8:
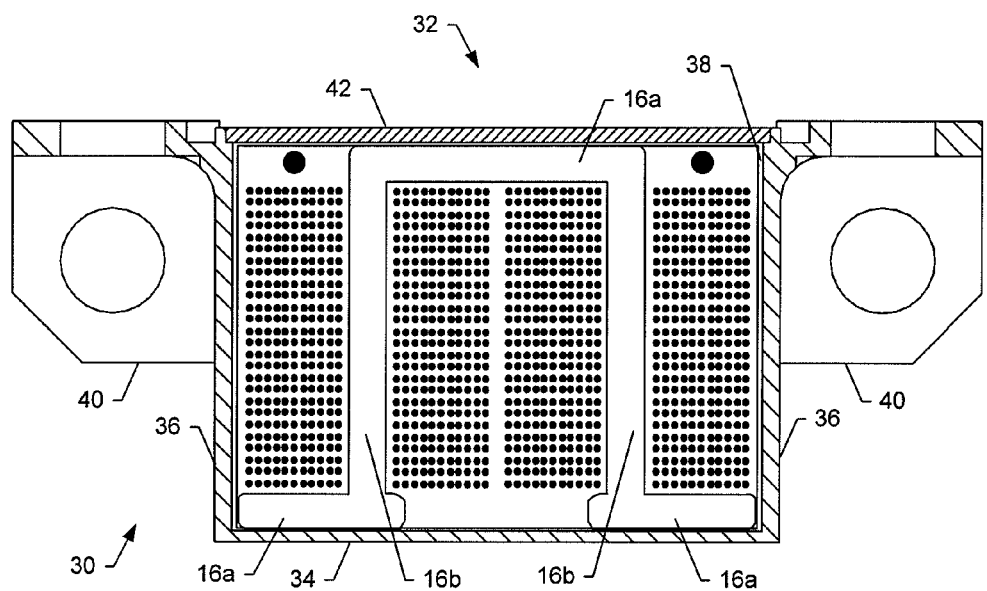
Figure 9:
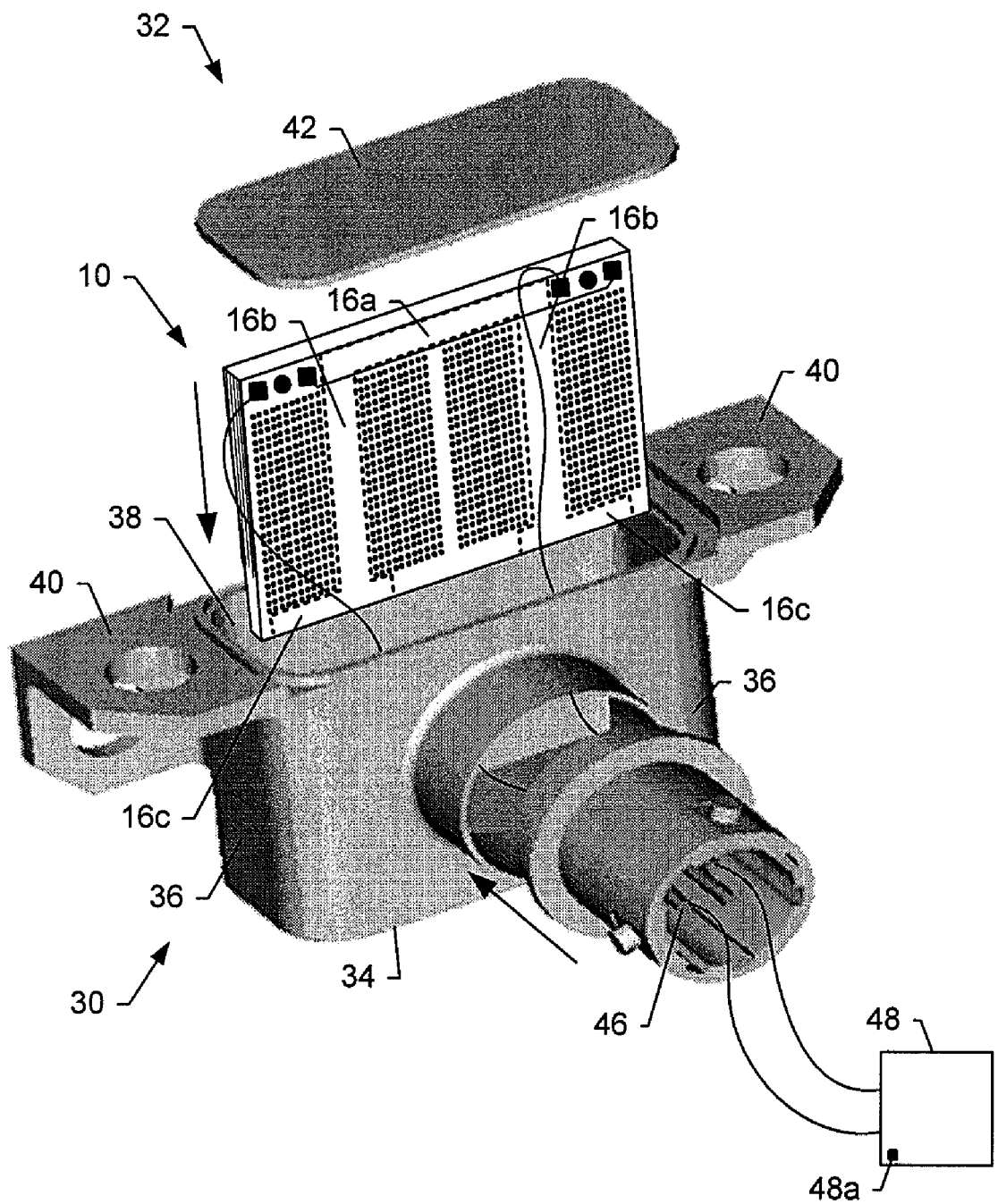
Figure 10:
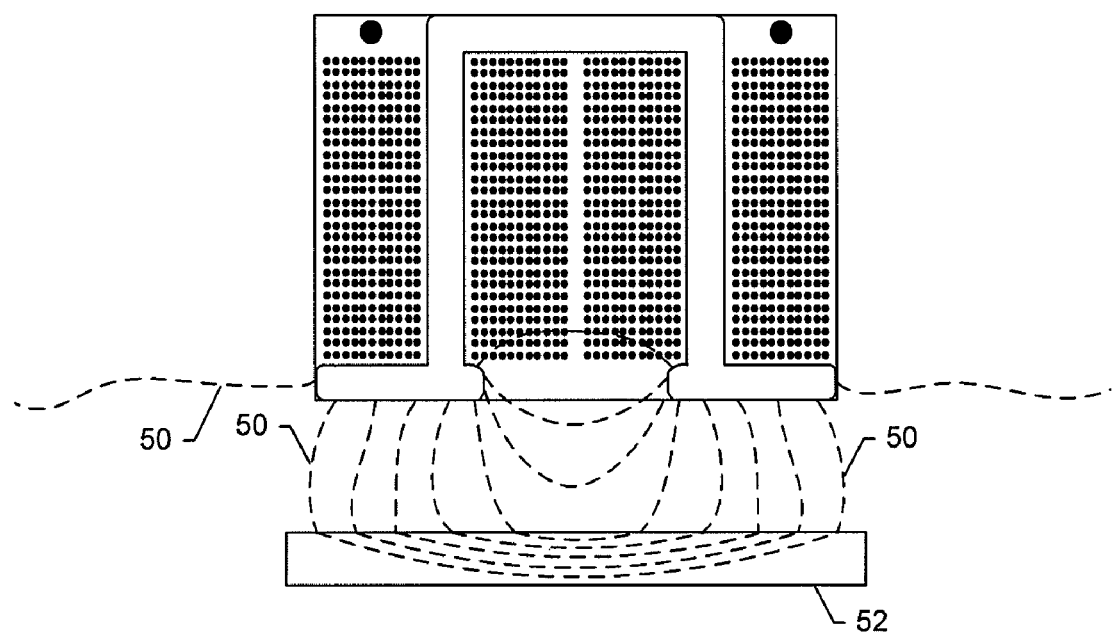
Figure 11:
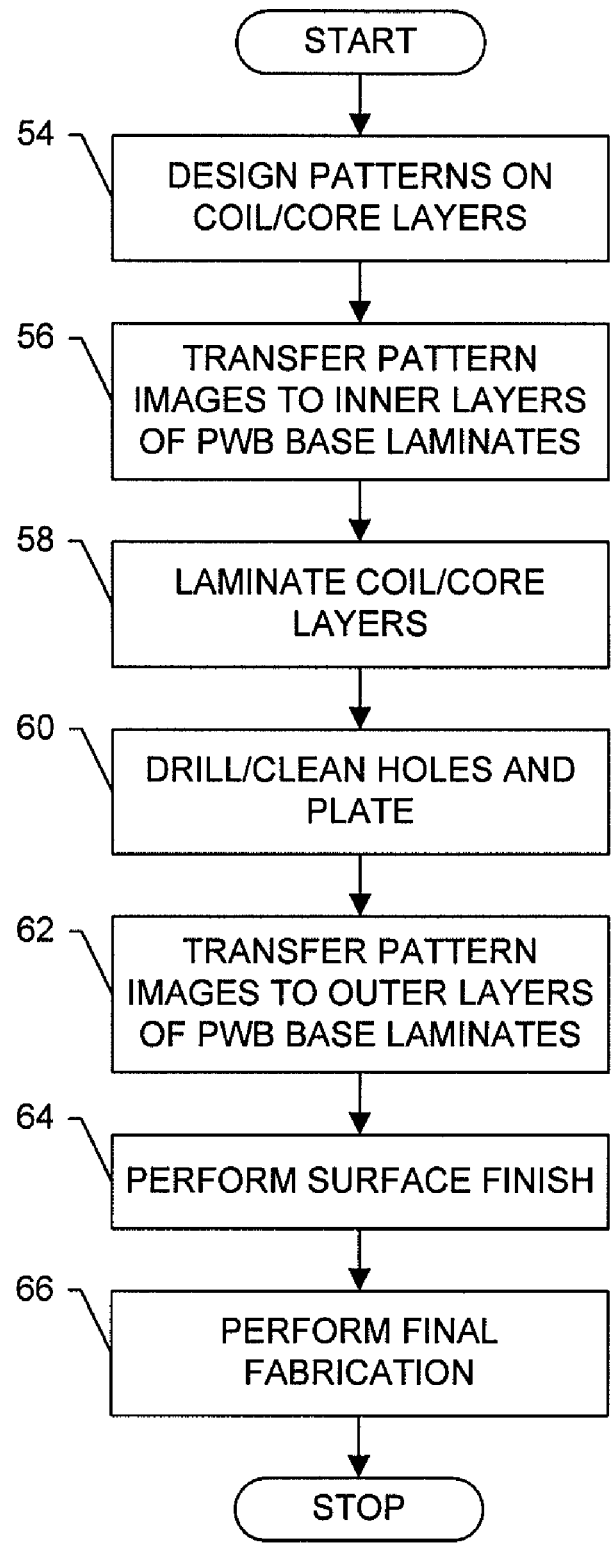

Having thus described the invention in general terms, reference will now be made to the accompanying drawings, which are not necessarily drawn to scale, and wherein:

FIG. 1 is a perspective view of a printed circuit-card based proximity sensor, in accordance with one embodiment of the present invention;

FIG. 2 is a top view of a printed circuit-card based proximity sensor, in accordance with one embodiment of the present invention;

FIG. 3 is a cross-section view of a printed circuit-card based proximity sensor, in accordance with one embodiment of the present invention;

FIG. 4 is an exploded side view of a printed circuit-card based proximity sensor, in accordance with one embodiment of the present invention;

FIG. 5 is a top view of a core layer of a printed circuit-card based proximity sensor, the core layer including a core pattern, in accordance with one embodiment of the present invention;

FIGS. 6a and 6b are top views of a pair of coil layers of a printed circuit-card based proximity sensor, the coil layers including coil traces capable of being interconnected by through-conductors (e.g., plated through-holes) in the layers of the proximity sensor, in accordance with one embodiment of the present invention;

FIG. 7 is a perspective view of a proximity sensor assembly including a housing within which a printed circuit-card based proximity sensor can be disposed, in accordance with one embodiment of the present invention;

FIG. 8 is a cross-sectional view of the proximity sensor assembly of FIG. 7 illustrating the printed circuit-card based proximity sensor within the housing;

FIG. 9 is an exploded perspective view of the proximity sensor assembly of FIG. 7 illustrating the printed circuit-card based proximity sensor being disposed within the housing, and a circuit electrically coupled to the proximity sensor assembly, in accordance with one embodiment of the present invention;

FIG. 10 is a schematic top view of an operation of a proximity sensor assembly illustrating an alternating magnetic field being generated by the assembly and a permeable and/or conductive object being brought or otherwise moved into the alternating magnetic field, in accordance with one embodiment of the present invention;

FIG. 11 is a flowchart illustrating various steps in a method of fabricating a proximity sensor in accordance with one embodiment of the present invention; and FIGS. 12a-12dd illustrate exemplary coil and core layers of a thirty-layer printed circuit-card based proximity sensor, in accordance with one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Reference is now made to FIGS. 1, 2, 3 and 4, which illustrate a perspective view, a top view, a cross-section view and an exploded side view, respectively, of a printed circuit-card based proximity sensor 10, in accordance with one embodiment of the present invention. As shown, the proximity sensor comprises a PWB that includes a plurality of layers 12 stacked on top of one another. The layers of the multilayer PWB, then, can include at least one core layer 12a between a plurality of coil layers 12b, each layer being bonded to adjacent layers. As explained below, the core layer(s) can be constructed or otherwise fabricated to form the core of the proximity sensor, the core including at least one leg, but more typically a pair of legs. The coil layers, on the other hand, can be constructed or otherwise fabricated to form at least one wound coil, but more typically two wound coils, disposed around legs of the core.

As will be appreciated, each layer 12 of the multilayer PWB forming the proximity sensor 10 includes a non-conducting substrate 14, which can be formed from any of a number of different insulating materials. For example, the non-conducting substrate can be formed of fiberglass with an epoxy resin. The substrate of each layer can be either rigid, flexible, or a combination of the two (rigid-flex), each of which is well known to those skilled in the art. The substrates can have any of a number of different dimensions, but in one typical embodiment, the substrates have a thickness of 0.041-0.039 inches.

Each substrate 14 includes two major, opposed surfaces. Upon one or both of the surfaces of the substrate, then, each layer can include a pattern or circuit. The pattern can be formed of any of a number of materials. For example, the pattern 16 on each core layer 12a (hereinafter referred to as the "core pattern") can be formed of any of a number of different permeable materials. In one advantageous embodiment, for example, each core layer is formed of laminations of HyMu 80®, an 80% nickel and 20% iron alloy available from Carpenter Technology Corporation of Wyomissing, Pa. Advantageously, by forming each core layer from a laminated material, the sensor 10 of embodiments of the present invention can operate with an enhanced signal-to-noise ratio by minimizing eddy currents otherwise generated in the core. Irrespective of the permeable material forming the core pattern on the core layer, however, the permeable material of the core layer(s) can collectively comprise the core of the proximity sensor.

Each core pattern 16 of each core layer 12a can have any of a number of different shapes. As shown in FIGS. 1 and 2, and more particularly in FIG. 5, for example, each core pattern can generally include a base 16a, a pair of legs 16b that extend in the same direction from opposite ends of the base, and a pair of feet 16c extending in opposite directions from respective legs. As shown, the legs can extend perpendicularly from the base, and the feet can extend perpendicularly from the legs. In such an instance, then, the feet can be parallel with the base. The portions of the core patterns can likewise have any of a number of different dimensions. In one embodiment, for example, the base, legs and feet can have a width of 1.16 inches, and be 0.002-0.004 inches thick. Individually, then, the base can have a length of 0.66 inches, while the legs each have a length of 0.77 inches, and the feet have a length of 0.33 inches. As will be appreciated, by forming the laminated core layers, including the core patterns, with a narrow thickness (e.g., 0.043 inches), the proximity sensor 10 can function with a faster rise time of a signal indicating the presence of a permeable and/or conductive object (as a function of slide-by distance), as compared to conventional proximity sensors having a typical core width of approximately 0.30 inches. Thus, the proximity sensor of embodiments of the present invention can operate with greater resolution in indicating the presence of a permeable and/or conductive object leading edge, and provide a "crisper" response.

The pattern 18 on each coil layer 12b can comprise at least one trace (hereinafter referred to as the "coil trace") and can be formed of any of a number of different conducting materials. In one advantageous embodiment, for example, the each coil trace can be formed of copper. Alternatively, each coil trace can be formed of nickel, silver, tin, tin-lead, gold, alloys and/or combinations thereof without departing from the spirit and scope of the present invention. The coil traces can comprise traces capable of forming a portion of the wound coils disposed around the legs of the core. The coil traces can then be interconnected by through-conductors in the layers 12 of the sensor 10. Whereas the through-conductors can comprise any of a number of conductors capable of interconnecting the coil traces, in one embodiment the through-conductors comprise plated through-holes 20, only one of which is shown in FIG. 4. More particularly, as shown in FIGS. 6a and 6b, each layer 12 of the sensor 10 can include a plurality of plated through-holes 20 arranged in at least one group 22 of plated through-holes about a position of each of the legs 16b of the core patterns 16 on the core layers 12a in the multilayer PWB. Each group of plated through-holes includes at least one column 24 of plated through-holes. Each column, then, has at least one pair of rows (e.g., rows 26a and 26b) of plated through-holes, where the plated through-holes of each pair are disposed on opposite sides of the position of a respective leg, typically equidistant from the position of the respective leg.

Advantageously, the coil traces 18 on the coil layers 12b and the plated through-holes 20 can be configured to collectively form the wound coils of the proximity sensor 10, where each wound coil is disposed around a respective leg 16b of the core patterns 16. In this regard, FIG. 3 illustrates a cross section of the sensor highlighting the conductive interconnections of the coil traces and the plated through-holes to form the wound coils of the proximity sensor. As shown in FIG. 3, each wound coil includes at least one level of at least one turn of the coil. Each level of turns of a coil, then, can be formed from one or more of the plated through-holes and the coil traces 18 of a pair of coil layers 12b, one layer on each side of the core layers 12a. In this regard, the coil layers can be grouped into at least one pair of coil layers, where the coil layers of each pair are disposed proximate opposite sides of the coil layers, such as in a manner equidistant from the core layers.

Generally, each turn of each wound coil is formed by connecting two plated through-holes (one on each side of the position of a leg 16b of the core layers 12a) with two corresponding coil traces 18 of a pair of coil layers 12b on either side of the core layers. The connection then progresses in a "square spiral" manner to produce square coil turns. One or more additional levels of turns of each wound coil can then be formed, with each level formed outboard of a previously formed level of turns (further distant from the position of the leg), and with each level connected to each adjacent level by means of coil traces. The process then continues with each level formed from traces on pairs of coil layers. After forming the wound coils, ends of each wound coil can be electrically coupled to pads 28a, 28b on a top coil layer (see FIGS. 1 and 2) with one of the pads being electrically coupled to a corresponding pad connected to an end of the other wound coil to create a closed loop circuit between the two coils. Alternatively, one end of the wound coils can be electrically coupled to one another, with the other end of the wound coils electrically coupled to a respective pad. Generally, then, the ends of the coils can be electrically coupled to the pads such that when a bias is placed across a pair of pads, current flows in one direction (e.g., clockwise) through one of the wound coils, and in an opposite direction (e.g., counterclockwise) through the other of the wound coils. In this regard, one of the coils can be considered to have been wound in one direction (e.g., clockwise) about a leg of the coil layers, while the other coil is wound in the opposite direction (e.g., counterclockwise) around the other leg of the coil layers.

More particularly, as shown in FIG. 6a, to form each level of turns of a coil, a coil trace on one of a pair of coil layers 12b connects a plated through-hole 20 in a given column 24 and row of a pair of rows 26 (e.g., row 26a on one side of the position of a leg 16b of the coil layers) to a plated through-hole in the other of the pair of rows in the same column (e.g., row 26b on the other side of the position of the respective leg). On the other coil layer of the pair of coil layers, then, a coil trace connects one of the previously connected plated through-holes (in a given column and row of a pair of rows) to a plated through hole in the other of the pair of rows in the next adjacent column (on the other side of the position of the respective leg), as shown in FIG. 6b. The plated through-holes of the pair of coil layers are then connected in a like manner through the rows. Then, when the coil layer of the pair does not have another column (i.e., next adjacent column), the coil trace connects the previously connected plated through-hole to a plated through hole in a next adjacent row in the same column. By connecting the previously connected plated through-hole to the plated through-hole in the next adjacent row in the same column, a level of coil turns is connected to the next adjacent level of coil turns.

As will be appreciated, the greater the number of turns per coil of the proximity sensor 10, the greater the sensitivity of the proximity sensor. In this regard, the number of columns 24 in each group of plated through-holes 20 in the layers 12 defines the number of turns in each level of each coil. For example, when each group of plated through-holes includes twenty-six columns, each coil can include twenty-six turns per level. Likewise, the number of levels of turns of coil is defined by the lesser of the number of pairs of coil layers 12b (the coil layers of each pair disposed proximate opposing sides of the core layers 12a) and the number of pairs of rows 26 of plated through-holes, with the number of pairs of coil layers being capable of equaling the number of pairs of rows of plated through-holes (except that the coil layers can include an additional pair of coil layers with one layer including the pads 28a, 28b and the other layer including "all-pads"). For example, when the number of pairs of coil layers equals twelve, but the number of pairs of rows of plated through-holes equals eleven, each coil can include eleven levels of turns. The total number of turns per coil, then, can equal the product of the number of turns per level and the number of levels of turns. For example, when each coil of the proximity sensor includes twenty-six turns per level, and eleven levels of turns, the each coil can include two hundred eighty-six turns.

As shown in FIGS. 7 and 8, the proximity sensor 10 can be placed within a housing 30 to form a sensor assembly 32. The housing can comprise any of a number of different housings, including any of a number of housings well known to those skilled in the art. In this regard, the housing can include a front surface 34 and four sidewalls 36. The front surface and side walls, then, define an interior chamber 38 into which the proximity sensor is secured or otherwise disposed. The housing can also include two flanges 40 extending outward from the opposite sidewalls. The flanges, then, include a means for mounting or otherwise securing the housing to an external object. For example, the flanges can define holes through which bolts, screws, nails, pins or the like can extend and into the external object. The housing can be formed from any of a number of different materials, but is typically formed from a low, if not negligibly, magnetic material having a low permeability. For example, the housing can be formed of an AISI (American Iron and Steel Institute) type 3xx stainless steel. It should be understood, however, that the housing can alternatively be formed of any of a number of different non-magnetic or nearly non-magnetic plastics.

The sensor assembly 32, including the proximity sensor 10 and the housing 30, can be assembled in any of a number of different manners. As shown in FIG. 9, for example, the housing also includes a cap 42 that can be removed to expose the interior chamber 38 for the insertion of the proximity sensor. To assemble the sensor assembly, then, the sensor is slid into the interior chamber. As will be appreciated, the front surface of the housing opposite the cap, is configured to face a desired target. Thus, the sensor is slid into the interior chamber such that the feet 16c of the core patterns 16 of the core layers are disposed proximate the front surface, and the base 16a of the core patterns are disposed proximate the cap. By sliding the sensor into the interior chamber with the orientation shown, the sensor assembly produces a sensed area during operation that extends out from the front surface in a generally hemispherical shape, and within which the proximity sensor is capable of sensing permeable and/or conductive objects. After sliding the sensor into the interior chamber, the cap is secured to the housing, such as in any manner known to those skilled in the art.

To electrically connect the sensor assembly 32, one of the pads 28a, 28b connected to an end of one of the wound coils is electrically coupled to a corresponding pad connected to an end of the other wound coil to create a closed loop circuit between the two coils. The other two pads are connected to electrical contacts of a connector 46. Alternatively, the sensor assembly can include a single pair of pads such that one end of the wound coils is electrically coupled to one another, with the other end of the wound coils electrically coupled to a respective pad. The pads can then be connected to the electrical contacts of a connector. An alternating current (AC) can then be provided to the two wound coils via the connector, such from a circuit 48 including or otherwise in electrical communication with a power source. In this regard, the connector can be coupled to the circuit, either directly or indirectly, such as via a pigtail cable. In either instance, the circuit can be configured to detect the inductance of the two coils. In this regard, the circuit can comprise any of a number of different circuits capable of operating in accordance with embodiments of the present invention. For example, the circuit can comprise or be incorporated into an LCR meter (Inductance/Capacitance/Resistance), as such are well known to those skilled in the art. By detecting the inductance, the proximity sensor and circuit are capable of detecting the presence of permeable and/or conductive objects by sensing variations in the inductance of the two coils, such as in any of a number of different variable-reluctance and/or eddy current loss techniques for detecting permeable and/or conductive objects.

As just explained, the proximity sensor 10 is placed within a housing 30 to form a sensor assembly 32. It should be understood, however, that the proximity sensor need not be placed within a housing. For example, the proximity sensor can be electrically connected to a circuit 48 to thereby form a sensor assembly without a housing. In such instances, the sensor assembly and circuit can be configured in a number of different manners, such as by forming, mounting or otherwise securing the sensor assembly and the circuit to a PWB or other substrate.

Referring briefly to FIG. 10, in operation, an external AC current source (e.g., circuit 48) drives the coils of the proximity sensor 10 such that the proximity sensor generates an alternating magnetic field (represented by flux lines 50). Then, when a permeable object 52 is brought or otherwise moved into the alternating magnetic field, the reluctance (i.e., air gap resistance) between the object and the proximity sensor changes, or more particularly, decreases. As the reluctance decreases, the inductance of the coils increases. This increase can then be measured, such as by the circuit 48, to thereby detect the proximity of the object.

As described above, the proximity sensor 10 operates as a variable-reluctance sensor to detect the presence of permeable objects 52. It should be understood, however, that the proximity sensor can additionally or alternatively be configured to operate as an eddy current loss sensor for detecting the presence of conductive object such as aluminum, copper, silver or the like. And although the proximity sensor can be constructed in the same manner regardless of its operation as a variable-reluctance or eddy current loss sensor, the proximity sensor can be constructed with a reduced number of core layers 12a (e.g., one or two core layers) to operate as an eddy current loss sensor since the core layers can serve to minimize the eddy current loses that otherwise facilitate its operation to sense the presence of objects.

In operation as an eddy current loss sensor, as before, an external AC current source (e.g., circuit 48) drives the coils of the proximity sensor 10 such that the proximity sensor generates an alternating magnetic field (flux lines 50). However, when a conductive object is brought or otherwise moved into the alternating magnetic field, the conductive object draws a portion of the magnetic field thereby inducing eddy currents in the conductive object. These eddy currents lead to an increase in current passing through the wound coils of the proximity sensor which, in turn, cause a decrease in the inductance of the coils. Like the inductance, the change in inductance can then be measured, such as by the circuit 48, to thereby detect the proximity of the conductive object.

As will be appreciated, in addition to detecting the change in inductance of the coils of the proximity sensor when a permeable and/or conductive object is brought or otherwise moved into the alternating magnetic field generated by the proximity sensor 10, the circuit 48 can be configured to perform one or more functions based upon the increase in inductance. For example, along with the sensor assembly 32, the circuit can function as a proximity switch. In such an instance, the circuit can include an output port or terminal 48a to which an external electronic device can be electrically coupled. In operation, then, the circuit can switchably produce an open condition or a closed condition at the output terminal based upon a proximity of a permeable and/or conductive object with respect to the proximity sensor, or more particularly the sensor assembly 32.

More particularly, the circuit 48 can be configured to monitor the inductance of the coils of the proximity sensor 10, and compare that inductance to a threshold. Operating as a variable-reluctance proximity sensor, when the inductance is below the threshold, thereby indicating that a target permeable object 52 is located far from the sensor assembly 32, the circuit can produce an open circuit condition (i.e., open condition) at the output terminal. When the inductance is at or above the threshold, thereby indicating that the target permeable object is located proximate the sensor assembly, the circuit can produce a power (e.g., 28 volts DC) condition (i.e., closed condition) at the output terminal. In contrast, operating as an eddy current loss proximity sensor, when the inductance is at or above the threshold, thereby indicating that a target conductive object is located far from the sensor assembly 32, the circuit can produce an open circuit condition (i.e., open condition) at the output terminal. In contrast, when the inductance is below the threshold, thereby indicating that the target conductive object is located proximate the sensor assembly, the circuit can produce a power condition (i.e., closed condition) at the output terminal. In either operational mode, by switching between the open circuit condition and the power condition, the circuit can control power to the external device coupled to the output terminal of the circuit.

Reference is now made to FIG. 11, which illustrates various steps in a method of fabricating a proximity sensor 10 in accordance with one embodiment of the present invention. In the following description, the proximity sensor includes six core layers 12a and twenty-four coil layers 12b. It should be understood, however, that the proximity sensor can include any of a number of core layers and coil layers other than those shown and described herein, without departing from the spirit and scope of the present invention. As shown in block 54, a method of fabricating the proximity sensor can include designing the core patterns 16 and coil traces 18 of the core layers and the coil layers, respectively. The core patterns and coil traces can be designed in any of a number of different manners. For example, the core patterns and coil traces can be designed using computer-aided design (CAD) techniques to produce circuit image files (e.g., "Gerber files") for each core layer and coil layer. The circuit image files can then be sent to a photo-plotter for generating thin film photo-tools based upon the circuit image files, if so desired.

Figure 12A:
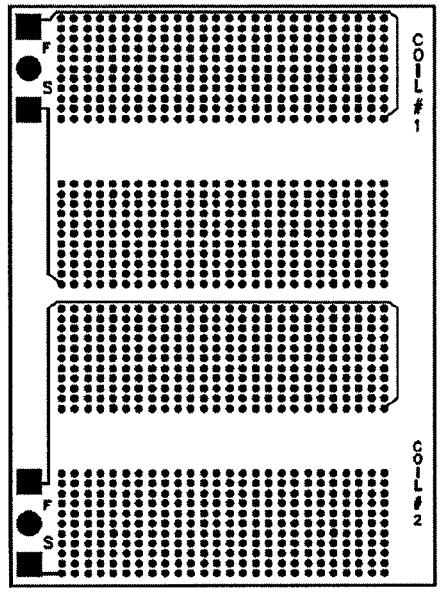
Figure 12C:
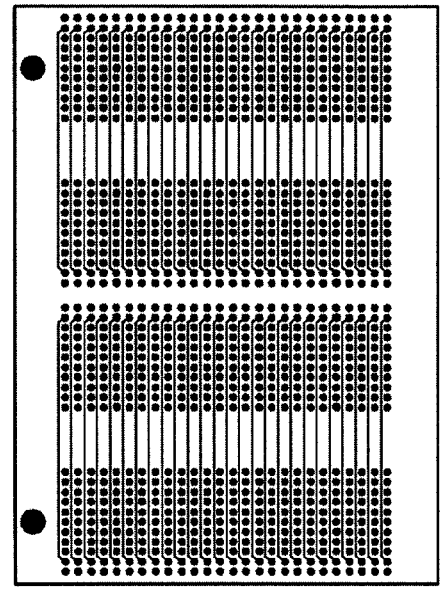
Figure 12B:
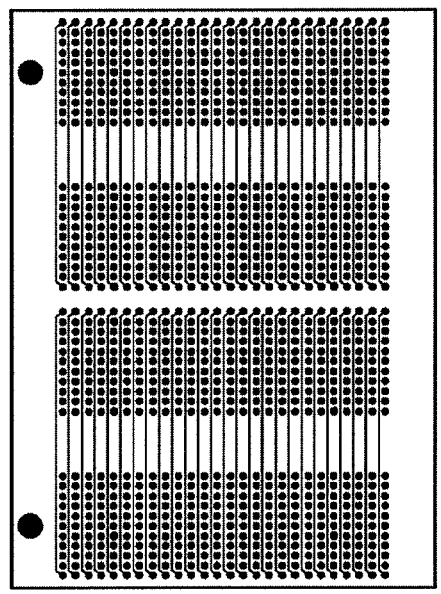
Figure 12D:
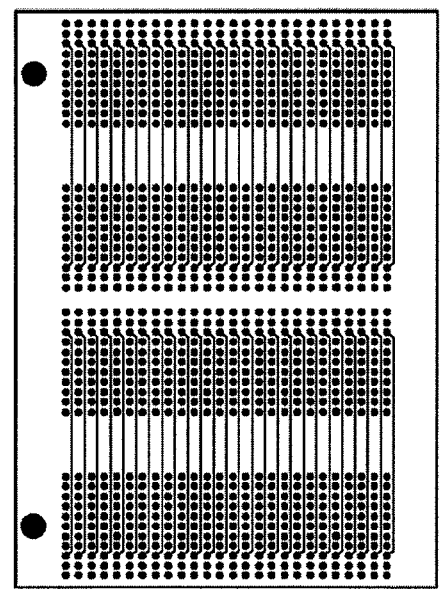
Figure 12E:
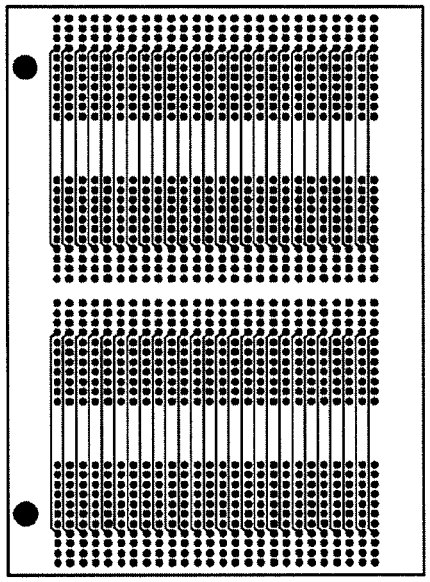
Figure 12G:
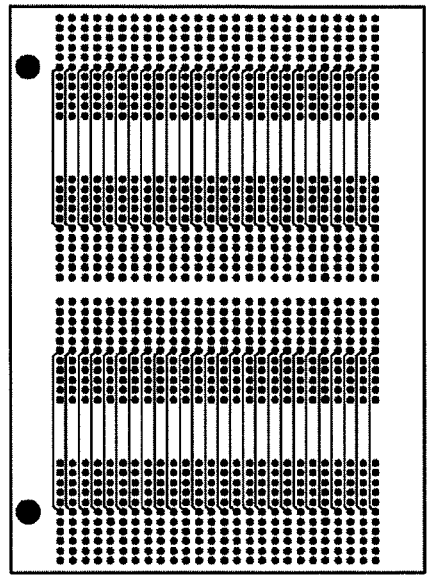
Figure 12F:
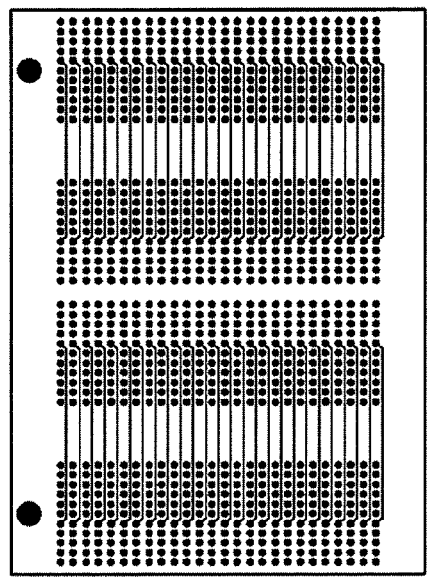
Figure 12H:
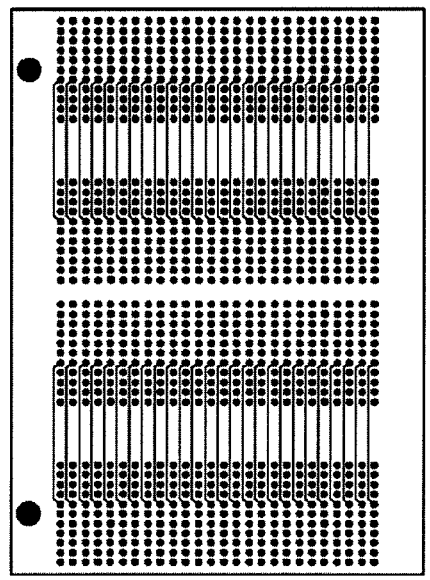
Figure 12I:
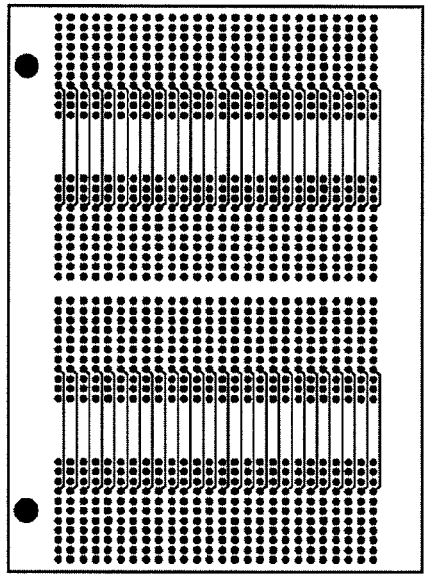
Figure 12K:
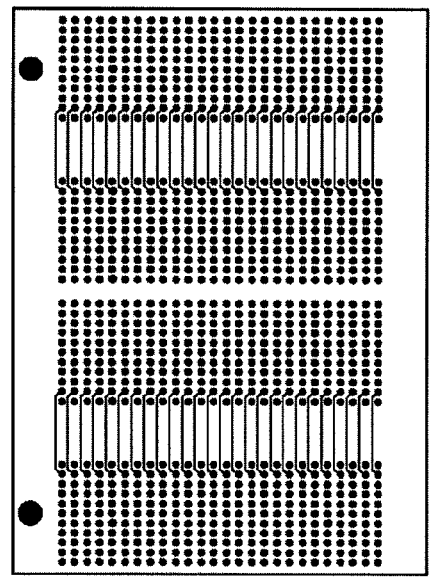
Figure 12J:
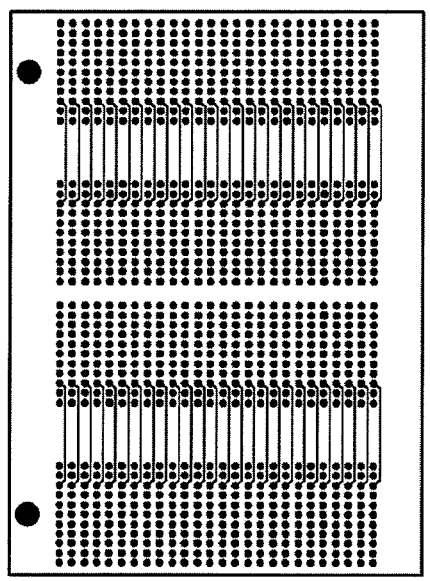
Figure 12L:
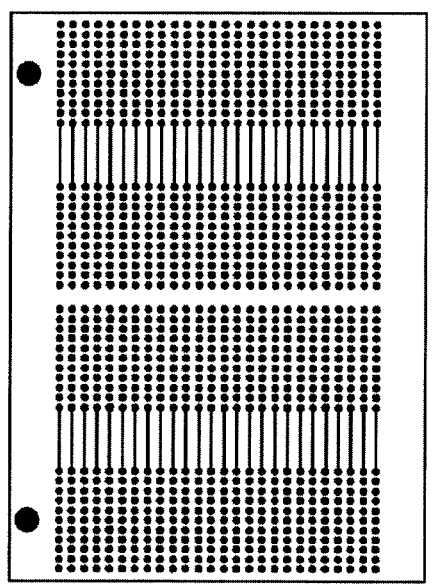
Figure 12M:
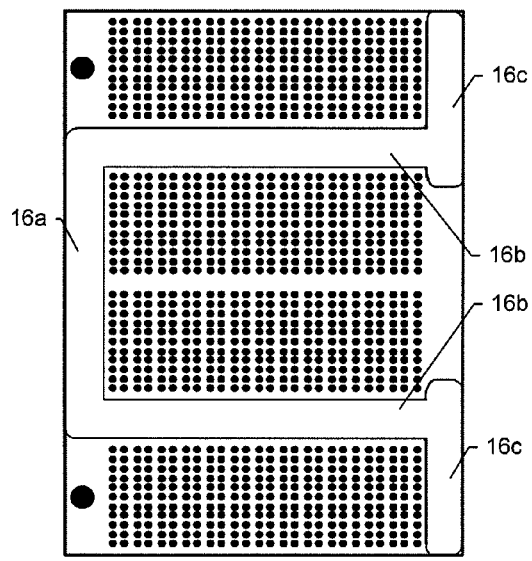
Figure 12O:
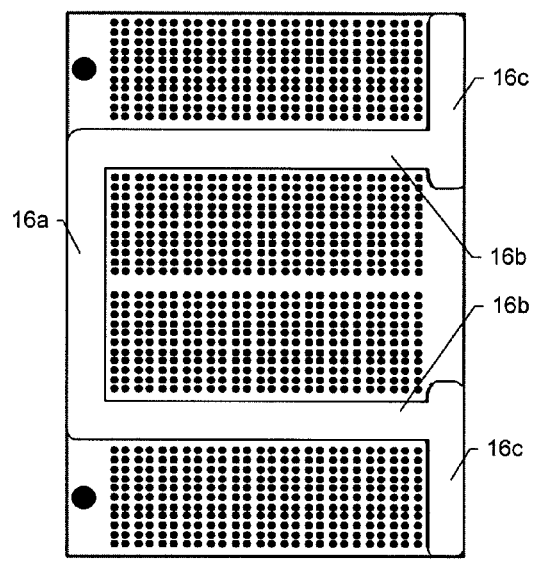
Figure 12N:
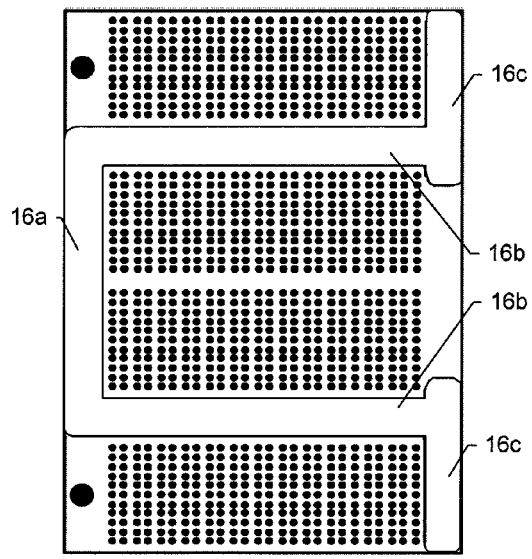
Figure 12P:
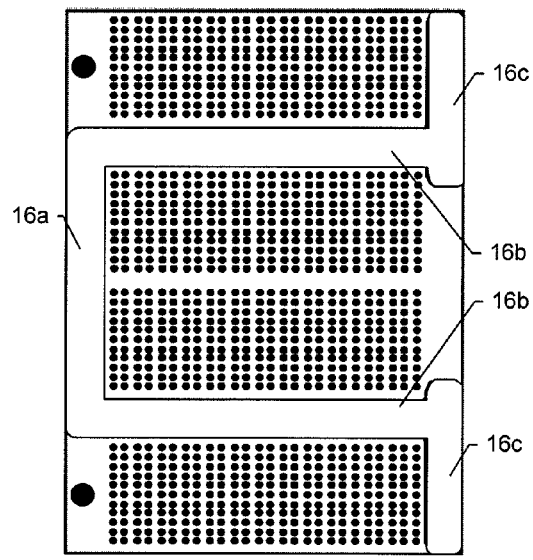
Figure 12Q:
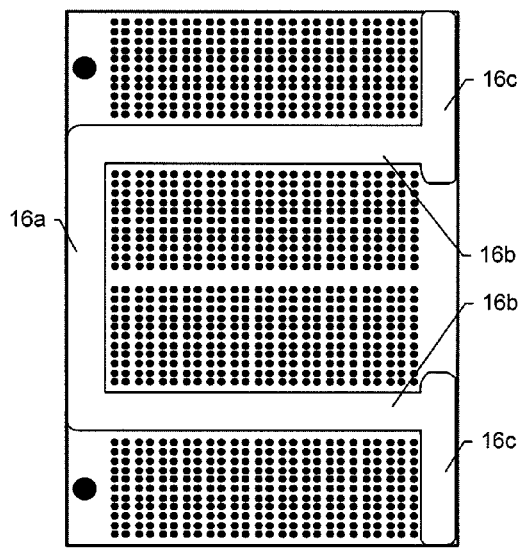
Figure 12S:
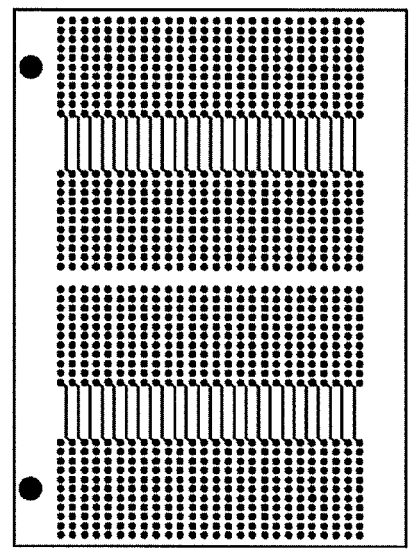
Figure 12R:
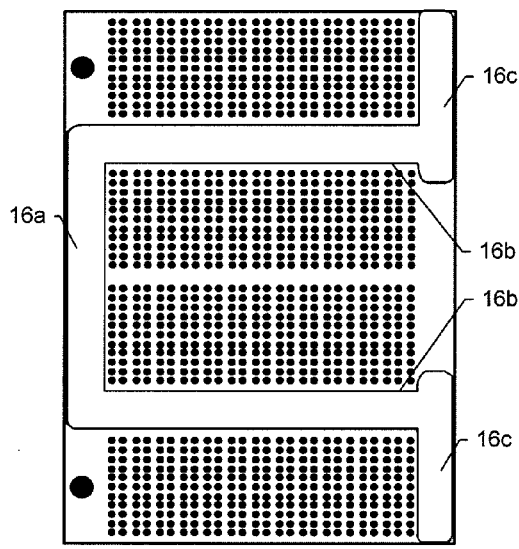
Figure 12T:
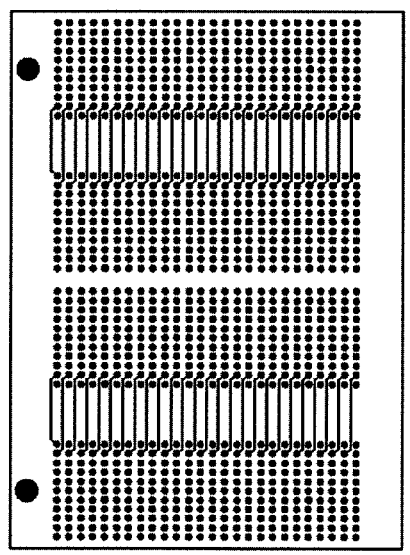
Figure 12U:
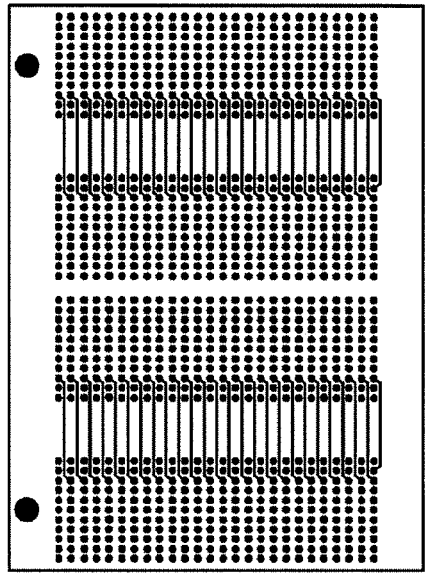
Figure 12W:
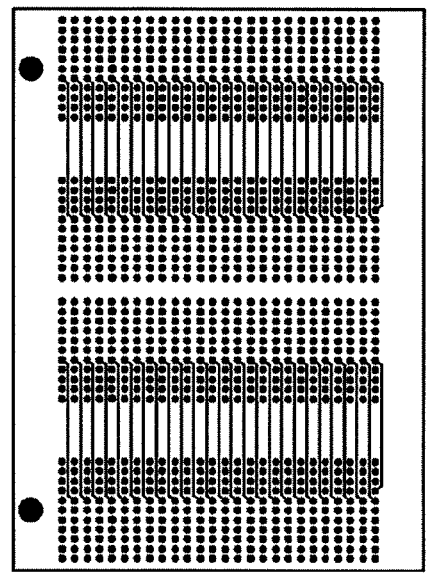
Figure 12V:
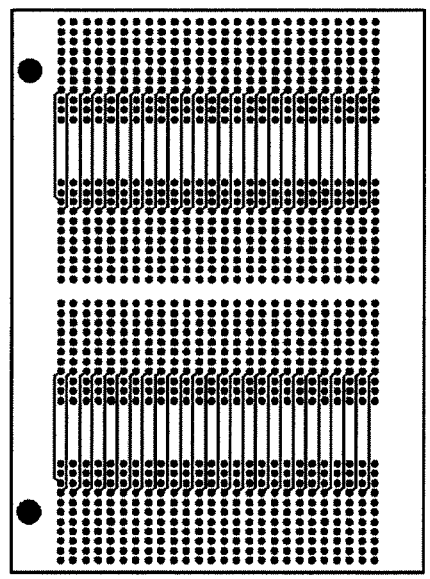
Figure 12X:
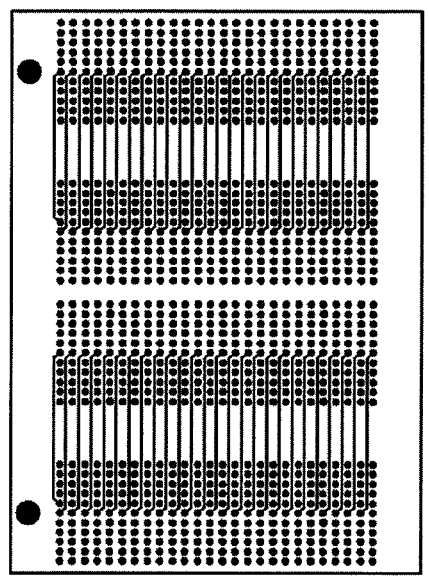
Figure 12Y:
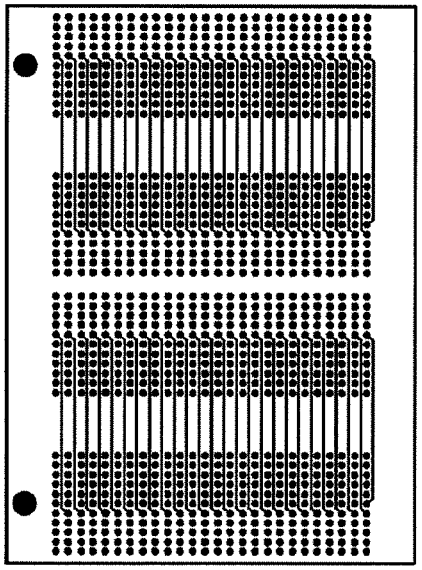
Figure 12A:
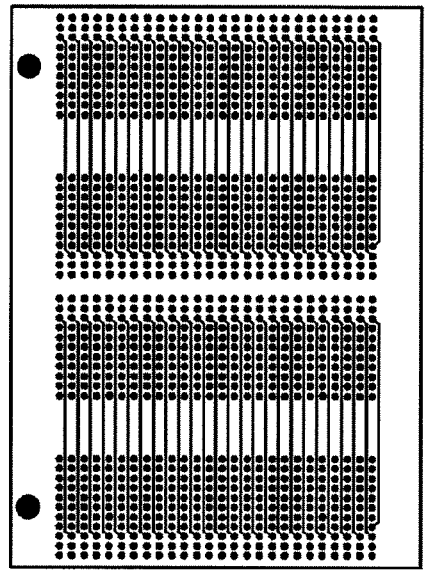
Figure 12Z:
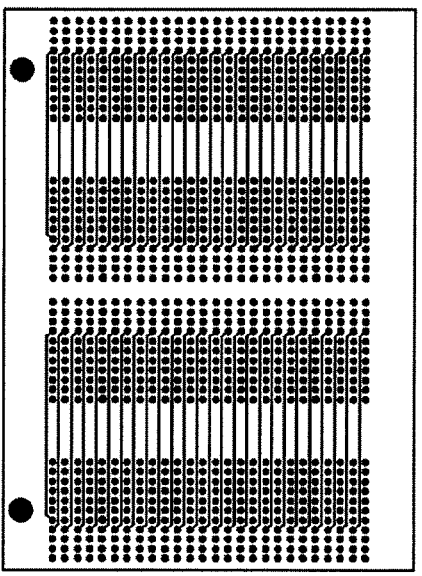
Figure 12B:
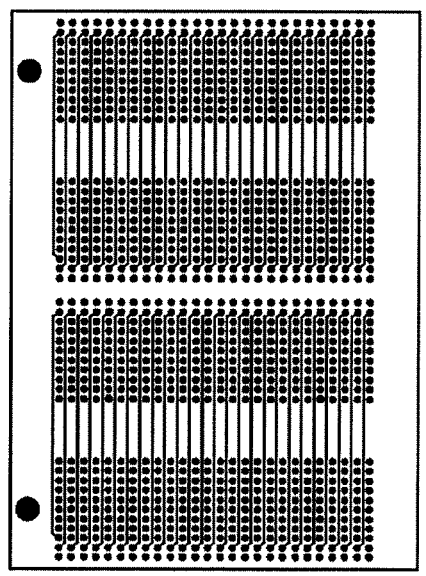
Figure 12C:
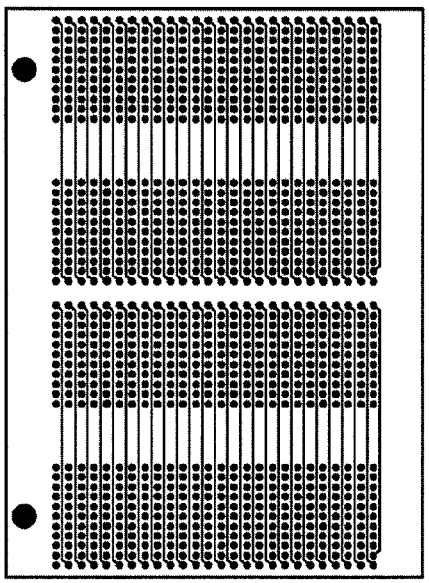
Figure 12E:
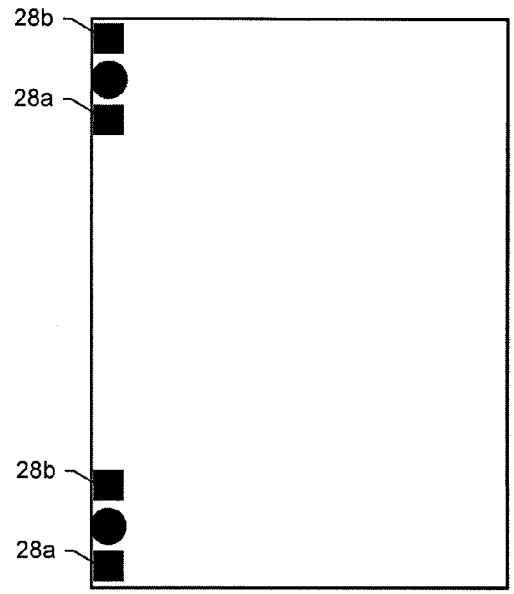
Figure 12D:
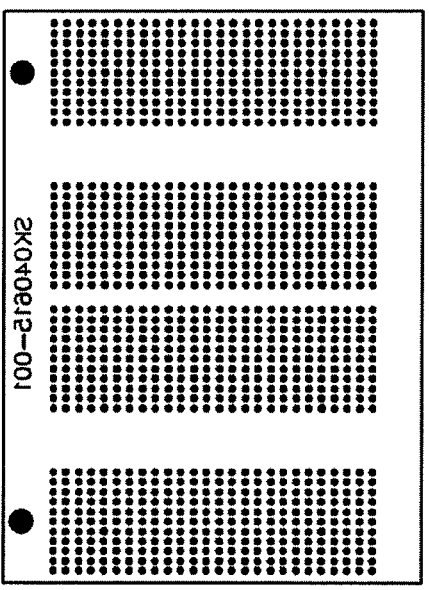
Figure 12F:
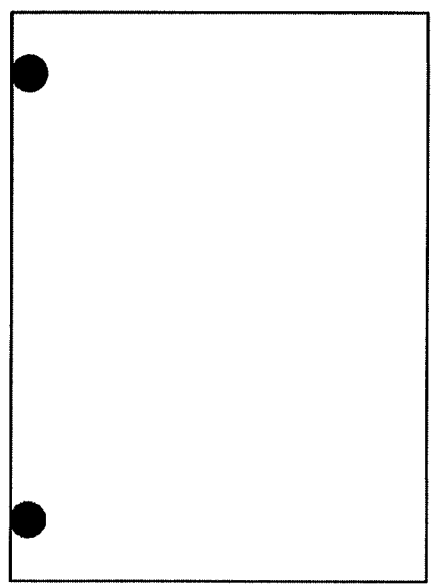

For an example of the core patterns 16 and core traces 18, as well as the plated through-holes 20, for each core and coil layer 12a, 12b of a thirty layer proximity sensor, see FIGS. 12a-12dd. In this regard, FIGS. 12m-12r illustrate the layers including the core patterns of each layer which, in the particular embodiment shown, are identical to each other. However, it is to be understood that the core patterns could slightly vary. FIGS. 12a-12l and 12s-12dd illustrate the coil layers disposed proximate opposing sides of the core layers. Within the coil layers, then, FIGS. 12a and 12dd comprise the outermost pair of coil layers, FIGS. 12b and 12cc the next outermost pair of coil layers, and so forth until reaching the coil layers of FIGS. 12l and 12s, which comprise the innermost pair of coil layers.

After designing the core patterns 16b and coil traces 18 of the respective layers 12, the images of the core patterns of the core layers 12a and coil traces of the inner coil layers 12b can be transferred from respective photo-tools (or directly from a respective circuit image file) to base foil-clad laminates, as shown in block 56. In this regard, for the core layers, the foil can comprise a permeable material (e.g., HyMu 80®), while the foil for the coil layers can comprise a conductive material (e.g., copper). Each image can be transferred to a base laminate in any of a number of different manners well known to those skilled in the art. For example, the image can be transferred to the base laminate in accordance with a "print-and-etch" technique. In accordance with one such "print-and-etch" technique, a photoresist can be applied to the surface foil of the base laminate such that when the photoresist is exposed and developed using a respective photo-tool, the pattern or trace can be transferred to the photoresist. The imaged photoresist can then function as an etch-resist such that exposed portions of the foil can thereafter be etched away with only the image of the pattern or trace remaining. The photoresist can then be stripped to reveal the pattern or trace remaining beneath it.

Next, the etched core layers and inner coil layers 12a, 12b can be laminated along with base foil-clad laminate for the two outer coil layers to thereby combine the respective layers into the multilayer PWB, as shown in block 58. In accordance with one conventional technique for laminating the core and coil layers, the core layers and inner coil layers can be assembled in a stack sandwiched between the base foil-clad laminate for the two outer coil layers (the foil of the laminate facing outward). As the layers are stacked, a B-stage material or prepreg (substrate material with semi-cured epoxy) is placed between each layer 12, including the etched core and inner coil layers and the foil-clad laminate for the outer coil layers. Holding the stack in place by tooling pins, heat and pressure can be applied to cause the B-stage material to bond the layers together into a multilayer PWB.

After laminating the etched core and coil layers 12a, 12b and the foil-clad laminate of the outer coil layers, the plated through-holes 20 can be fabricated. To fabricate the plated through-holes, vias or holes can be drilled into the PWB to connect the inner and outer layers, as shown in block 60. The holes can be drilled in any of a number of different manners well known to those skilled in the art, such as by means of computer numerical controlled (CNC) drilling equipment operating a tungsten-carbide drill. Irrespective of how the holes are drilled, each coil trace 18 of each inner coil layer can extend into the barrel of a pair of holes such that the coil trace can be interconnected with one or more coil traces of one or more other coil layers when the hole barrel is metallized.

After drilling the holes, the holes can be cleaned, such as in accordance with a desmearing technique, to remove any amount of epoxy-resin from the barrels of the holes, including any epoxy-resin that may have smeared across the coil traces as the holes were drilled. Next, the holes are coated or plated through with a conductive material, such as copper. In accordance with one conventional plating technique, a seed layer of a conductive material is plated or coated onto the barrels of the holes. Thereafter, as explained below, a thicker layer of conductive material is deposited onto the seed layer, such as in accordance with an electroplating technique. As will be appreciated, by plating the holes with a conductive material, the resulting plated through-holes 20 electrically couple coil traces 18 of the coil layers 12b, such as in a manner explained above.

After fabricating the plated through-holes 20, the images of the coil traces 18 of the outer pair of coil layers 12b are then transferred from respective photo-tools (or directly from a respective circuit image file) to base foil-clad laminates, as shown in block 62. In accordance with a print, pattern-plate and etch technique, for example, the images of the coil traces of the outer coil layers 12b are transferred from respective photo-tools (or directly from a respective circuit image file) to the outer layer base foil-clad laminates of the PWB, such as in a manner similar to that for the core patterns 16 and the coil traces of the inner coil layers (see block 56). However, when imaging the coil traces of the outer pair of coil layers, the photoresist is applied to the surface foil of each of the outer base laminates such that when the photoresist is exposed and developed using a respective photo-tool, the traces of the outer coil layers are developed away, exposing the underlying conductive material. Next, the coil traces 18 of the outer pair of coil layers 12b, and the barrels of the holes (including a seed layer of conductive material) are plated, with the remaining photoresist on the outer layers functioning as plating resist. In this regard, the outer pair of coil layers and barrels of the plated through-holes are plated in accordance with an electroplating technique.

Once the coil traces 18 and the barrels of the holes have been plated, a metallic etch-resist (e.g., tin, tin-lead, nickel-gold, etc.) is plated over the previous plating. Then, the photoresist (functioning as plating resist) is stripped from the outer coil layers 12b, such as in the same manner as the photoresist is stripped from the core layers 12a and the inner coil layers. Next, the exposed portions of the foil are etched away, such as with an ammoniacal etchant, with only the metallic etch-resist plated over the plated foil (in the form of the outer coil layer trace(s)) remaining. Finally, the metallic etch-resist is stripped off, exposing the plated foil.

After transferring the images of the coil traces 18 of the outer pair of coil layers 12b to base foil-clad laminates, a surface finish is performed to prevent oxidation of the conductive material, facilitate solderability, and prevent defects during assembly of the proximity sensor 10, as shown in block 64. As will be appreciated, any of a number of different processes can be applied to the multilayer PWB proximity sensor during surface finishing, including a solder-mask-over-bare-copper (SMOBC) with hot-air-solder-leveling (HASL). In accordance with a conventional SMOBC technique, a solder mask (see FIGS. 12ee and 12ff), such as a thermally cured screen printed mask, dry film mask, liquid photoimagible (LPI) mask or the like, is applied to the front and back of the multilayer PWB. By applying the solder masks, then, those portions of the multilayer PWB not requiring solder or soldering can be masked off, and physically and electrically insulated. Then, in accordance with a HASL technique, the front and back of the multilayer PWB is processed in a bath of molten solder to cover all exposed conductive surfaces. Thereafter, high-pressure hot air can be simultaneously directed at both sides of the PWB to thereby remove excess solder from the plated through-holes and the surfaces.

Once the surface finish is complete, final fabrication of the proximity sensor 10 can be performed, such as to add pads 28a, 28b, non-plated through-holes and/or other tooling features, if so desired, as shown in block 66. Also, as will be appreciated, as the proximity sensor comprises a multilayer PWB, the proximity sensor can be fabricated on a multilayer panel including a plurality of proximity sensors. Thus, during final fabrication, the proximity sensors can be depanelized by breaking or otherwise routing the multilayer panel into the separate proximity sensors.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A proximity sensor comprising:
a multilayer printed wiring board proximity sensor including:
   a core formed of a permeable material,
   a plurality of dielectric layers in a stacked configuration, and
   a plurality of conductive paths extending through the stacked layers in an operatively connected configuration to form at least one coil disposed about at least a portion of the core,
wherein the coils are electrically drivable to generate a magnetic field such that the inductance of the coils changes when an object is moved in relation to the magnetic field, and such that a proximity of the object is detectable based upon a change in the inductance of the coils, wherein the plurality of layers of the multilayer printed wiring board comprise:
   at least one core layer, each core layer comprising a core pattern formed of a permeable material, the core patterns of the core layers together comprising the core of the proximity sensor;
   a plurality of coil layers, each coil layer comprising a conductive path in the form of at least one coil trace formed of a conducting material formed on at least one surface of the coil layer; and
   a plurality of through-conductors extending through at least a portion of the core layers and the coil layers and connected to the coil traces to thereby form the coils, and
wherein the core pattern of each core layer is formed of a lamination of the permeable material.

2. A proximity sensor according to claim 1, wherein the core pattern of each core layer comprises a pair of legs, and wherein the coil traces of the coil layers are interconnected by the through-conductors to thereby form a pair of coils, each coil being disposed about a leg of the core patterns of the core layers.

3. A proximity sensor according to claim 1, wherein a top coil layer further comprises at least one pair of conductive pads, each conductive pad being electrically coupled to an end of the coils, and wherein the coils of the proximity sensor are electrically drivable via the conductive pads.

4. A proximity sensor according to claim 1, wherein the plurality of coil layers comprise at least one pair of coil layers, the coil layers of each pair being disposed proximate opposite surfaces of the coil layers, and wherein the coil traces of each pair are interconnected by the through-conductors to thereby form a level of the coils.

5. A proximity sensor according to claim 1 further comprising:
a circuit coupled to the proximity sensor, wherein the circuit is configured to detect the proximity of the object based upon a change in the inductance of the coils.

6. A proximity sensor according to claim 1 further comprising:
a housing including a front surface and defining an interior chamber, wherein the proximity sensor is disposed within the interior chamber to form a proximity sensor assembly such that, when the coils are electrically driven, the sensor assembly generates a sensed area extending outward from the front surface of the housing within which the proximity of the object is detectable.

7. A proximity sensor comprising:
a multilayer printed wiring board proximity sensor including:
   a core formed of a permeable material,
   a plurality of dielectric layers in a stacked configuration, and
   a plurality of conductive paths extending through the stacked layers in an operatively connected configuration to form at least one coil disposed about at least a portion of the core,
wherein the coils are electrically drivable to generate a magnetic field such that the inductance of the coils changes when an object is moved in relation to the magnetic field, and such that a proximity of the object is detectable based upon a change in the inductance of the coils; and
a circuit coupled to the proximity sensor, wherein the circuit is configured to detect the proximity of the object based upon a change in the inductance of the coils, wherein the circuit includes an output terminal, and wherein the circuit is configured to switchably produce at least one of an open condition and a closed condition at the output terminal based upon the proximity of the object.

8. A proximity sensor according to claim 7, wherein the plurality of layers of the multilayer printed wiring board comprise:
   at least one core layer, each core layer comprising a core pattern formed of a permeable material, the core patterns of the core layers together comprising the core of the proximity sensor;
   a plurality of coil layers, each coil layer comprising a conductive path in the form of at least one coil trace formed of a conducting material formed on at least one surface of the coil layer; and
   a plurality of through-conductors extending through at least a portion of the core layers and the coil layers and connected to the coil traces to thereby form the coils.

9. A proximity sensor according to claim 7, wherein the circuit is configured to switchably produce an open condition when the inductance of the coils is below a threshold, and produce a closed condition when the inductance of the coils is at least as high as the threshold.

10. A proximity sensor according to claim 7, wherein the circuit is configured to switchably produce an open condition when the inductance of the coils is at least as high as a threshold, and produce a closed condition when the inductance of the coils is below the threshold.

11. A proximity sensor comprising:
a multilayer printed wiring board including a plurality of layers, the layers comprising:
   at least one core layer, each core layer comprising a core pattern formed of a permeable material, wherein the core pattern of each core layer comprises a pair of legs, each leg including first and second opposing ends, the first ends of the legs being spaced apart from one another, and the second ends of the legs being interconnected; and
   a plurality of coil layers, each coil layer comprising at least one coil trace formed of a conducting material,
wherein the core layers and the coil layers further comprise a plurality of through-conductors, and wherein the coil traces are interconnected by the through-conductors to thereby form at least one coil disposed about at least a portion of the core patterns of the core layers, and wherein the core pattern of each core layer is formed of a lamination of the permeable material.

12. A proximity sensor according to claim 11, wherein the coil traces of the coil layers are interconnected by the through-conductors to thereby form a pair of coils, each coil being disposed about a leg of the core patterns of the core layers.

13. A proximity sensor according to claim 11, wherein a top coil layer further comprises at least one pair of conductive pads, each conductive pad being electrically coupled to an end of the coils.

14. A proximity sensor according to claim 11, wherein the plurality of coil layers comprise at least one pair of coil layers, the coil layers of each pair being disposed proximate opposite surfaces of the coil layers, and wherein the coil traces of each pair are interconnected by the through-conductors to thereby form a layer of the coils.

15. A method of detecting a proximity of an object, the method comprising:
    providing a proximity sensor comprising a multilayer printed wiring board proximity sensor, wherein the proximity sensor includes a plurality of layers configured to form at least one coil disposed about at least a portion of a core;
    electrically driving the coils to generate an alternating magnetic field such that the inductance of the coils changes when an object is moved in relation to the magnetic field;
    detecting a proximity of the object based upon change in the inductance of the coils; and
    switchably producing one of an open condition and a closed condition at an output terminal based upon the proximity of the object.

16. A method according to claim 15 further comprising assembling a proximity sensor assembly in a housing including a front surface and defining an interior chamber, the proximity sensor being disposed within the interior chamber.

17. A method according to claim 15, wherein the provided proximity sensor assembly comprises a multilayer printed wiring board proximity sensor including:
    at least one core layer, each core layer comprising a core pattern formed of a permeable material, the core patterns of the core layers comprising the core of the proximity sensor; and
    a plurality of coil layers, each coil layer comprising at least one coil trace formed of a conducting material,
    wherein the core layers and the coil layers further comprise a plurality of through-conductors, and wherein the coil traces are interconnected by the through-conductors to thereby form the coils.

18. A method according to claim 15, wherein switchably producing one of an open condition and a closed condition comprises switchably producing an open condition when the inductance of the coils is below a threshold, and producing a closed condition when the inductance of the coils is at least as high as the threshold.

19. A method according to claim 15, wherein switchably producing one of an open condition and a closed condition comprises switchably producing an open condition when the inductance of the coils is at least as high as a threshold, and producing a closed condition when the inductance of the coils is below the threshold.

* * * * *